United States Patent [19]

Noro

[11] 4,406,990
[45] Sep. 27, 1983

[54] DIRECT COUPLED DC AMPLIFICATION CIRCUIT

[75] Inventor: Masao Noro, Asaka, Japan
[73] Assignee: Stax Industries, Ltd., Tokyo, Japan
[21] Appl. No.: 296,096
[22] Filed: Aug. 26, 1981
[30] Foreign Application Priority Data
Aug. 28, 1980 [JP] Japan ............................ 55-117741
[51] Int. Cl.³ .......................... H03F 3/45; H03F 3/26
[52] U.S. Cl. .................................. 330/296; 330/261; 330/267
[58] Field of Search .............. 330/252, 261, 263, 267, 330/307, 296

[56] References Cited
FOREIGN PATENT DOCUMENTS
625301 9/1978 U.S.S.R. ........................... 330/263

Primary Examiner—Michael J. Lynch
Assistant Examiner—Gene Wan
Attorney, Agent, or Firm—Sughrue, Mion, Zinn, Macpeak and Seas

[57] ABSTRACT

A direct-coupled DC amplification circuit effects amplification over all the amplification stages using a ground potential as the reference voltage, and yet supplies a load with voltages in both positive and negative directions. In one preferred embodiment, a second or subsequent amplification stage including a phase compensating element has an amplification element in the form of cascode-connected complementary transistors connected to positive and negative power input terminals via first and second constant current circuits, respectively, and the set current of the first constant current circuit is set to be twice greater than that of the second constant current circuit. The disclosed arrangement enables to completely eliminate the influences of noise component superposed with the power source voltage, and to drastically improve the power source noise suppression ratio alone up to a high frequency range, independently of such dynamic characteristics of the amplification circuit as the slew rate, band width, operation speed and the like.

3 Claims, 6 Drawing Figures

FIG_3
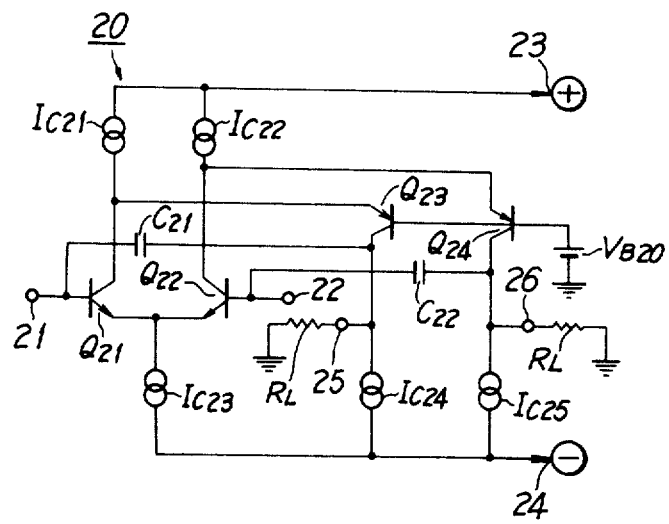
FIG_4
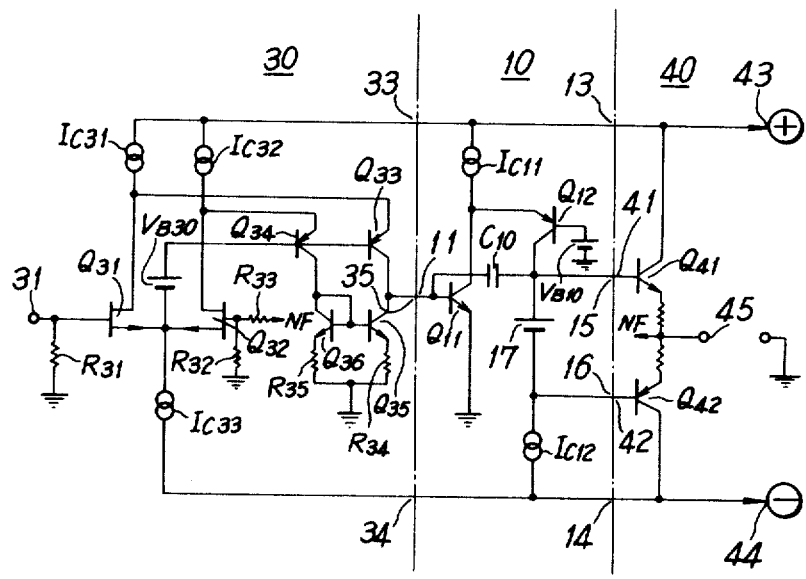

DIRECT COUPLED DC AMPLIFICATION CIRCUIT

BACKGROUND OF THE INVENTION

1. Field of the Invention

This invention relates to a direct-coupled DC amplification circuit. More particularly, the present invention is directed to provide an amplification circuit which effects amplification over all the amplification stages using a ground potential as the reference voltage, and which affords an extremely high power source noise suppression ratio up to a high frequency range.

2. Description of the Prior Art

An amplification element forming a second or subsequent amplification stage of a heretofore known direct-coupled amplification circuit generally makes use of a power source voltage as its reference voltage. Accordingly, the amplification element amplifies the difference between a signal voltage delivered from the preceding initial or second stage and the power source voltage. When the amplification element is composed of transistors (FETs or other transistors), even if the power source voltage is superposed with low frequency components, the influence of the low frequency components is negligible with respect to the output, because the output impedance of the element is low. Hence, a sufficient power source noise suppression ratio can be obtained at least in a low frequency range. The fact that negative feedback (NF) quantity of the amplifier as a whole is generally greater at low frequencies, also contributes to the improvement in the power source noise suppression ratio in the low frequency range.

In an amplification stage having the highest voltage gain and the lowest pole in the amplification circuit, design is made so that the pole is further reduced by a phase compensating capacitor to maintain stability of the circuit as a whole.

The operation of a conventional second or subsequent amplification stage including the phase compensating capacitor will here be described. As shown in FIG. 1, this amplification stage includes two transistors $Q_1$, $Q_2$ that are cascode-connected to each other, and the phase compensating capacitor C is interposed between the collector of the transistor $Q_2$ and the base of the transistor $Q_1$. The emitter of the transistor $Q_1$ is connected to the positive power terminal. A buffer transistor for increasing an output current or the like is connected as a load $R_L$.

In the amplification stage having the above-mentioned construction, when the frequency exceeds its pole (e.g., from several hundred Hertz to several tens of thousands Hertz) and the capacitor effect comes to appear, the transistors $Q_1$, $Q_2$ function as a kind of inverting feedback circuit, thereby forming the pole. Since negative feedback is applied from the collector of the transistor $Q_2$ to the base of the transistor $Q_1$ via the capacitor C, the capcitor describes a $-6$ dB/OCT curve. This is the intended purpose of this capacitor C. The problem here is that since the emitter of the transistor $Q_1$ is connected to the power terminal, the power source voltage serves as the reference potential for the amplification stage consisting of the transistors $Q_1$ and $Q_2$. If the capacitor C is not included, there is no relation between the base voltage of the transistor $Q_1$ and the output impedance of the transistor $Q_2$, because the latter is extremely high. When, however, the capacitor C is disposed as illustrated in the drawing, the potentials at the emitter of the transistor $Q_1$, at the collector of the transistor $Q_2$ and at the base of the transistor $Q_1$ are closely associated with one another in the high frequency range in which negative feedback is applied through the capacitor C.

In the frequency range sufficiently higher than the pole of the amplification stage and including a flat practical band in the output characteristics of the amplifier, the output voltage $\Delta V$ of the amplification stage is given by the following euqation:

$$\Delta V = -\frac{\Delta i}{\omega C} + \Delta v \quad (1)$$

where $\Delta i$ is a current fed, C is capacitance of the capacitor, $\omega$ is angular frequency and $\Delta v$ represents noise components contained in the power source voltage.

As is obvious from the above equation, the signal voltage $$\left(-\frac{\Delta i}{\omega C}\right)$$

in the output voltage decreases with an increasing frequency $$f\left(=\frac{\omega}{2\pi}\right).$$

In contrast, though the noise component ($\Delta v$) is never amplified so as to exceed 1 by the transistors $Q_1$, $Q_2$, it is independent of the frequency and so is always contained in the output voltage $\Delta V$. In order to suppress the influences of the noise component $\Delta v$ on the output voltage, therefore, it is necessary to apply the negative feedback to the amplifier as a whole, so that the noise suppression ratio may be represented by a reciprocal of the total negative feedback quantity. The noise suppression ratio decreases as the frequency becomes higher, because the negative feedback quantity in the amplifier as a whole drops in the frequency range higher than the pole formed by the amplification stage.

It has conventionally been believed generally, that an increased operation speed and a broader band of the amplification circuit are necessary factors for obtaining a high power source noise suppression ratio up to the high frequency range. It is certainly true that in the conventional circuit, the signal component ($\Delta i/\omega C$) must be increased with respect to the noise component $\Delta v$ in order to enhance the power source noise suppression ratio. More definitely, this can be accomplished by increasing the current fed $\Delta i$ and reducing the capacitance C. In addition, large quantities of negative feedback may be applied up to the high frequency range. These directly result in the increase in the operation speed of the amplifier and broadening of its band. As for the amplifiers, however, there are a wide range of applications in which the broadening of the band and the increase of the operating speed are not really necessary, and only the power source noise suppression ratio needs to be increased. In other words, an amplifier having an unnecessarily broad band and an unnecessarily high operation speed must often be employed merely in order to obtain a high power source noise suppression ratio. However, such an amplifier is generally not so easy to use because it has the problems that oscillation is likely to occur and unnecessary waves are picked up due to its broader band.

When the output band is relatively narrow as in active band-pass filters or the like, the power source noise may seem reduced even when an ordinary amplifier is used, because the pass band is narrow. In practice, however, the noise mixes inside the circuit and is as such delivered as the output. In other words, a broader band amplifier becomes necessary in this case, too, in order to reduce the influences of the power source noise.

As can be understood clearly from the foregoing description, the power source noise suppression ratio in the conventional amplification circuit is closely related with the dynamic characteristics (slew rate or the like) of the circuit or with its open loop characteristics and hence, it has generally been believed that the noise suppression ratio can not be discussed separately from these characteristics.

SUMMARY OF THE INVENTION

It is therefore an object of the present invention to independently improve the power source noise suppression ratio alone without unnecessarily broadening the band or unnecessarily increasing the operation speed of the amplifier. As a result, in accordance with the present invention, it is possible to rationally design the amplification circuit and to markedly improve both S/N ratio and amplification accuracy.

In order to accomplish the above-mentioned object, the present invention makes use of a ground potential as the reference voltage of an amplification element. Accordingly, the output voltage $\Delta V$ of the amplification circuit does not essentially contain the power source noise component $\Delta v$, as represented by the following equation:

$$\Delta V = - \frac{\Delta i}{\omega C} \quad (2)$$

The above does not mean that noise is not generated at all inside the amplification circuit. Noise does occur to some extent due to a degradation of constant current characteristics of a constant current circuit in the high frequency range or to junction capacitance between the collector and base of the buffer transistor at the final stage, for example. However, noise of this kind is on an order that can be neglected when compared with the noise generated by the power source voltage.

According to the present invention, there is provided a direct-coupled DC amplification circuit including an initial amplification stage and at least one subsequent amplification stage which is directly coupled to the initial stage and comprises in combination: a signal input terminal connected to the initial amplification stage as a signal voltage source; positive and negative power input terminals, one of which being connected to the collector of said first transistor via a first constant current circuit; a second transistor of a type complementary to said first transistor, having its emitter connected to a junction between the collector of said first transistor and said first constant current circuit; a bias voltage source connected to the base of said second transistor and supplying said second transistor with a bias voltage of a value between the power source voltage on the side of said first constant current circuit and the ground voltage; the other of said positive and negative power input terminals being connected to the collector of said second transistor via a second constant current circuit; a signal output terminal connected to a junction between the collector of said second transistor and said second constant current circuit and supplying a load with an amplified signal; and a phase compensating element connected between the collector of said second transistor and the base of said first transistor; whereby, among said first and second constant current circuits, the set current of said constant current circuit on the positive power input terminal side is set to be greater than that of said constant current circuit on the negative power input terminal side.

BRIEF DESCRIPTION OF THE DRAWINGS

FIG. 3 is an electric circuit diagram showing a modified embodiment of the amplification stage of FIG. 2;

FIG. 4 is an electric circuit diagram of a direct-coupled circuit equipped with the amplification stage of FIG. 2;

DESCRIPTION OF THE PREFERRED EMBODIMENTS

Hereinafter, the present invention will be described with reference to some preferred embodiments shown in FIGS. 2 through 6.

Figure 1:
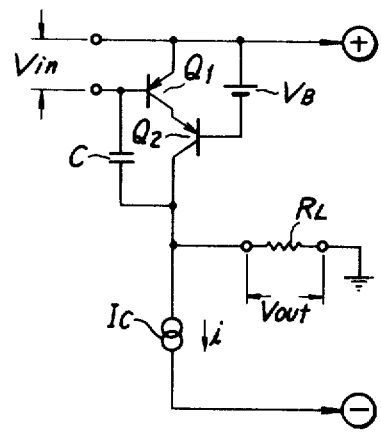
FIG. 1 is an electric circuit diagram showing the above-mentioned conventional amplification stage.
Figure 2:
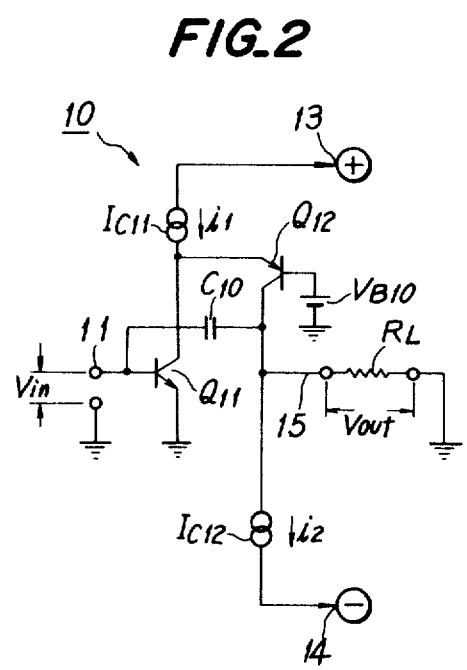
FIG. 2 is an electric circuit diagram showing one embodiment of the amplification stage in accordance with the present invention.

Referring now to FIG. 2, there is shown an amplification stage in accordance with the first embodiment of the present invention, which forms a second or subsequent amplification stage in a direct-coupled amplification circuit. This amplification stage 10 is directly coupled via a signal input terminal 11 to a signal voltage source, i.e. to an initial or preceding amplification stage (not shown). The base of a transistor $Q_{11}$ as the first amplification element is connected to the input terminal 11 and its emitter is grounded. The collector of the transistor $Q_{11}$ is connected to a positive power input terminal 13 of the power source via a first constant current circuit $I_{C11}$. A transistor $Q_{12}$ of a type complementary to the transistor $Q_{11}$ is used as the second amplification element. The emitter of this transistor $Q_{12}$ is connected to a junction between the collector of the transistor $Q_{11}$ and the constant current circuit $I_{C11}$. A bias voltage source $V_{B10}$ is connected to the base of the transistor $Q_{12}$. This bias voltage source $V_{B10}$ generates a bias voltage of a value between the output voltage of the constant current circuit $I_{C11}$ and the ground voltage. The collector of the transistor $Q_{12}$ is connected to a negative power input terminal 14 of the power source via a second constant current circuit $I_{C12}$. A load $R_L$ is connected via a signal output terminal 15 to a junction between the collector of the transistor $Q_{12}$ and the constant current circuit $I_{C12}$. A capacitor $C_{10}$ as a phase compensating element is connected between the collector of the transistor $Q_{12}$ and the base of the transistor $Q_{11}$. The set current $i_1$ of the first constant current circuit $I_{C11}$ is so set as to be greater (preferably twice greater) than the set current $i_2$ of the second constant current circuit $I_{C12}$.

Since the emitter of the transistor $Q_{11}$ is grounded in the amplification stage 10 having the above-mentioned construction, the amplification circuit operates with the ground voltage as the reference. Generally speaking, when an amplification circuit operates with the ground voltage as the reference, it is possible to feed only a voltage between the ground voltage and the positive power source voltage. Hence, in such a state, it is not possible to amplify a negative voltage. In accordance with the circuit arrangement shown in FIG. 2, since, $$i_1 > i_2 \quad (3)$$

as described already, the following equation is given with $I_{Q11}$ and $I_{Q12}$ representing the currents flowing through the transistors $Q_{11}$ and $Q_{12}$, respectively:

$$I_{Q12} = i_1 - I_{Q11} \quad (4)$$

In other words, this circuit operates in the following range:

$$0 < I_{Q11} < i_1 \quad (5)$$

The current $I_{RL}$ flowing through the load $R_L$ is given as follows:

$$\begin{aligned} I_{RL} &= I_{Q12} - i_2 \quad (6) \\ &= (i_1 - I_{Q11}) - i_2 \\ &= (i_1 - i_2) - I_{Q11} \end{aligned}$$

The current $I_{RL}$ becomes zero when $$i_1 - i_2 = I_{Q11} \quad (7)$$

As is apparent from the above-mentioned equation (6), the output voltage occurring in the load $R_L$ in the amplification circuit of FIG. 2 decreases when the current $I_{Q11}$ flowing through the transistor $Q_{11}$ increases, and negative potential can be produced at the output terminal 14 because the constant current circuit $I_{C12}$ is connected to the negative power terminal. In other words, voltage in both positive and negative directions can be fed to the load $R_L$. From the viewpoint of alternating current circuit, the transistor $Q_{12}$ can be regarded as being cascode-connected to the transistor $Q_{11}$.

In accordance with the circuit arrangement of FIG. 2, the maximum output voltage can be set at an arbitrary value between the bias voltage of the transistor $Q_{12}$ and the saturation voltage of the constant current circuit $I_{C12}$. Further, an extremely high power source noise suppression ratio can be obtained even if the phase compensating capacitor $C_{10}$ is interposed between the transistors $Q_{11}$ and $Q_{12}$. Needless to say, the maximum efficiency can be obtained when $i_1 = 2i_2$. However, this is not an essential requirement; what is necessary is just to satisfy the relation $i_1 > i_2$.

FIG. 3 shows another embodiment of the amplification stage, in which the arrangement shown in FIG. 2 is modified as a differential input-output type. The amplification stage 20 according to this embodiment includes a first pair of transistors $Q_{21}$ and $Q_{22}$ whose collectors are connected to the positive power input terminal 23 via first and second constant current circuits $I_{C21}$ and $I_{C22}$, respectively, while their emitters are connected to the negative power input terminal 24 via a common third constant current circuit $I_{C23}$. The collectors of a second pair of transistors $Q_{23}$ and $Q_{24}$, which are complementary to the first pair of transistors, are connected to the negative power input terminal 24 via fourth and fifth constant current circuits $I_{C24}$ and $I_{C25}$, respectively. The amplification stage 20 further includes differential input terminals 21, 22, differential output terminals 25, 26, phase compensating capacitors $C_{21}$, $C_{22}$ and a bias voltage source $V_{B20}$ for the second pair of transistors $Q_{23}$, $Q_{24}$. The relationship and connection between the transistors $Q_{21}$ and $Q_{23}$ and between the transistors $Q_{22}$ and $Q_{24}$ are substantially the same as in the arrangement of FIG. 2.

In this embodiment, the circuit can be operated with maximum efficiency by setting the current value of the first, second and third constant current circuit $I_{C21}$, $I_{C22}$ and $I_{C23}$, equal to each other but two times greater than the current value of the fourth and fifth constant current circuits $I_{C24}$ and $I_{C25}$, whose current values are also set equal to each other. In the other aspects, too, the circuit of FIG. 3 operates in substantially the same way as that of FIG. 2.

FIG. 4 shows one embodiment of a direct-coupled amplification circuit which includes an initial amplification stage 30 constructed in substantially the same way as the differential input-output type amplification circuit of the embodiment shown in FIG. 3. The differences reside in that the initial amplification stage 30 does not include the phase compensating elements and the fourth and fifth constant current circuits, and that the differential output of the second pair of transistors $Q_{33}$, $Q_{34}$ is synthesized by a current mirror circuit consisting of transistors $Q_{35}$, $Q_{36}$ and is fed to the input terminal of the second amplification stage 10. Elements in the initial amplification stage 30, which are identical with or corresponding to those shown in FIG. 3, are denoted by corresponding reference characters.

The second amplification stage 10 is constructed in substantially the same way as that shown in FIG. 2, which further includes a bias voltage source 17 for a buffer stage 40 formed by transistors $Q_{41}$, $Q_{42}$. The buffer stage 40 has signal input terminals 41, 42 connected to signal output terminals 15, 16 of the second amplification stage 10, positive and negative power input terminals 43, 44, and a signal output terminal 45 to be connected to a power amplification stage, not shown.

Incidentially, the initial amplification stage in FIG. 4 may have substantially the same construction as that shown in FIG. 2. In such a case, it is of course unnecessary to have a phase compensating element (corresponding to the capacitor $C_{10}$ in FIG. 2) disposed in the initial amplification stage.

Figure 5:
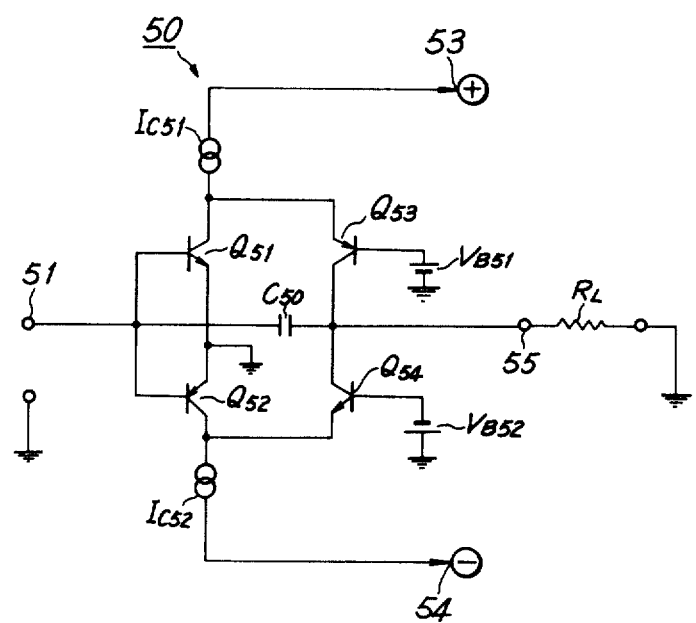
FIG. 5 is an electric circuit diagram showing still another modification of the amplification stage of FIG. 2.

FIG. 5 shows still another embodiment of the amplification stage, in which the arrangement shown in FIG. 2 is modified as a push-pull type. The amplification stage 50 according to this embodiment includes a first complementary pair of transistors $Q_{51}$ and $Q_{52}$ whose collectors are connected to the positive and negative power input terminals 53, 54 via first and second constant current circuit $I_{C51}$, $I_{C52}$, respectively, while their emitters are grounded. The collectors of a second complementary pair of transistors $Q_{53}$ and $Q_{54}$ are connected to each other. The relationship and connection between the transistors $Q_{51}$ and $Q_{53}$ and between the transistors $Q_{52}$ and $Q_{54}$ are substantially the same as in the arrangement of FIG. 2.

In this embodiment, for the transistors $Q_{51}$, $Q_{53}$, the constant current circuits $I_{C51}$, $I_{C52}$ operate in substantially the same manner as the first and second constant current circuits $I_{C11}$, $I_{C12}$ shown in FIG. 2, respectively. Similarly, for the transistors $Q_{52}$, $Q_{54}$, the constant current circuit $I_{C52}$, $I_{C51}$ operate in substantially the same manner as the first and second constant current circuits $I_{C11}$, $I_{C12}$ shown in FIG. 2, respectively. This circuit can be operated with the maximum efficiency by setting the current value of the first and second constant current circuits $I_{C51}$, $I_{C52}$ equal to each other and two times greater than set currents, which are equal to each other, of the first pair of transistors $Q_{51}$, $Q_{52}$ flowing therethrough in the idling condition thereof. In the other aspect, too, the circuit of FIG. 5 operates in substantially the same way as that of FIG. 2.

Figure 6:
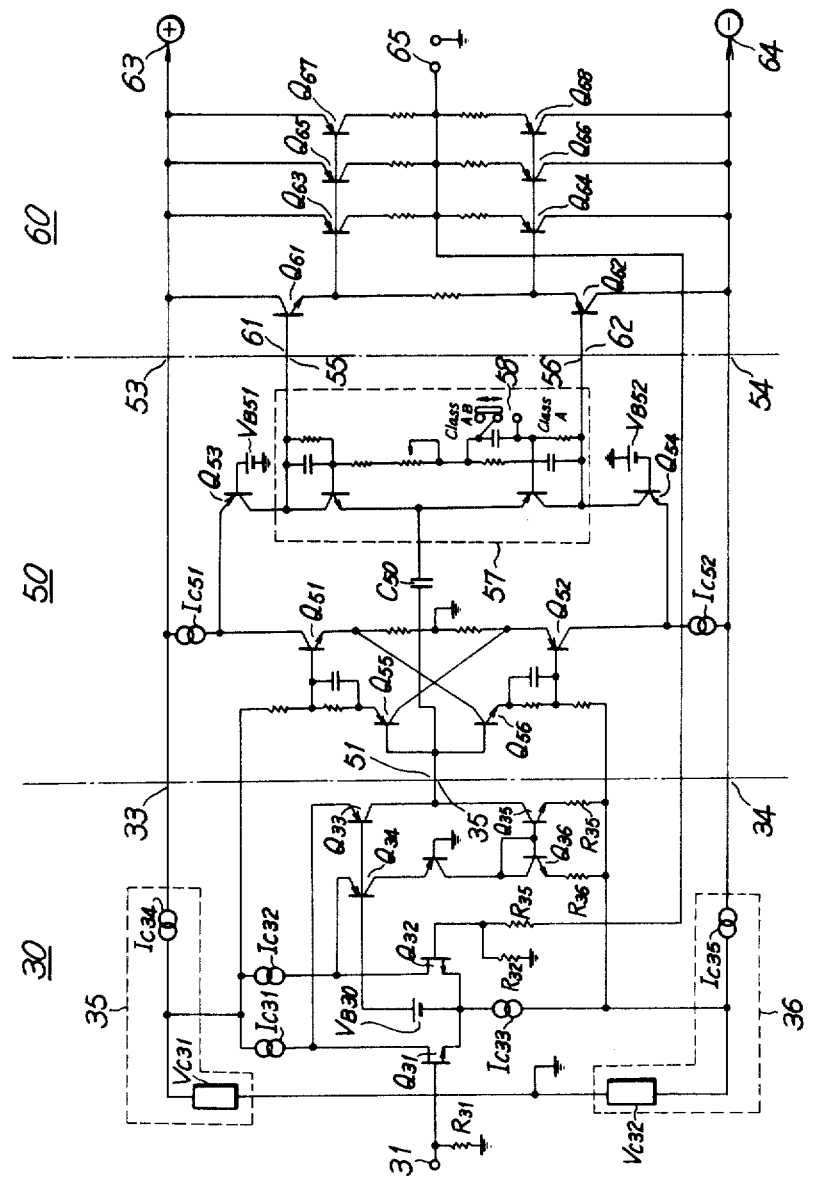
FIG. 6 is an electric circuit diagram of another direct-coupled circuit equipped with the amplification stage of FIG. 5.

FIG. 6 shows another embodiment of a directcoupled amplification circuit which includes an initial amplification stage, a second amplification stage and a power amplification stage. The initial amplification stage 30 is substantially the same as that shown in FIG. 4, except that the first and second constant current circuits $I_{C31}$, $I_{C32}$ as well as the third constant current circuits $I_{C33}$ are connected to the positive and negative power input terminals 33, 34 via shunt-regulated constant voltage power source devices 35, 36, respectively. The constant voltage power source device 35 includes a fourth constant current circuit $I_{C34}$ connected between the positive power input terminal 33 and the first and second constant current circuits $I_{C31}$, $I_{C32}$, as well as a first constant voltage circuit $V_{31}$ connected to the fourth constant current circuit $I_{C34}$ in parallel with the first and second constant current circuits $I_{C31}$, $I_{C32}$. Similarly, the constant voltage power source device 36 includes a fifth constant current circuit $I_{C35}$ connected between the negative power input terminal 34 and the third constant current circuit $I_{C33}$, as well as a second constant voltage circuit $V_{C32}$ connected to the fifth constant current circuit $I_{C35}$ in parallel with the third constant current circuit $I_{C33}$. Each of the constant voltage power source devices 35, 36 including the combination of a constant current circuit and a constant voltage circuit serves to lower the output impedance of the power supply circuit and to further improve the noise suppression ratio. Such a constant voltage power source device is fully disclosed in my copending continuation application of U.S. Ser. No. 67,509 filed on Aug. 17, 1979, entitled "Constant voltage power source device" and assigned to the assignee of this application.

The second amplification stage 50 is substantially the same as that shown in FIG. 5, except that the stage 50 includes a buffer circuit consisting of transistors $Q_{55}$, $Q_{56}$ connected between the signal input terminal 51 and the first pair of transistors $Q_{51}$, $Q_{52}$, respectively, as well as a bias voltage circuit 57 which generates the bias voltage to be supplied to one or more pairs of transistors $Q_{61}$ to $Q_{68}$ forming the power amplification stage 60. This bias voltage circuit 57 includes a switch 58 for determining the operation mode of the power amplification stage 60. More particularly, in the illustrated position of the movable contact member of the switch 58, the power amplification stage 60 effects class AB amplification, while when the movable contact member is moved downwardly in the figure, the power amplification stage 60 effects pure class A amplification.

The above-mentioned practical circuit arrangement proved to provide an extremely excellent S/N ratio of more than 155 dB (input equivalent noise: less than $-125$ dB) when used in a pure class-A monaural DC power amplifier having the maximum output of 100 W.

As can be clearly appreciated from the foregoing description, in accordance with the amplification circuit of the present invention, voltages in both positive and negative directions can be fed to the load notwithstanding the fact that the ground voltage is used as the reference voltage for driving the transistors. Accordingly, it is possible to completely eliminate the influences of the noise component superposed with the power source voltage in the amplification stage including the phase compensating element, and the power source noise suppression ratio can be drastically improved up to high frequency ranges without unnecessarily increasing the operation speed of the amplification circuit or without unnecessarily broadening its band.

What is claimed is:

1. An amplification stage for a direct-coupled DC amplification circuit, comprising in combination:
   an input terminal connected to a signal voltage source;
   a first transistor having its base connected to said input terminal and its emitter grounded;
   positive and negative power input terminals, one of which being connected to the collector of said first transistor via a first constant current circuit;
   a second transistor of a type complementary to said first transistor, having its emitter connected to a junction between the collector of said first transistor and said first constant current circuit;
   a bias voltage source connected to the base of said second transistor and supplying said second transistor with a bias voltage of a value between the power source voltage on the side of said first constant current circuit and the ground voltage;
   the other of said positive and negative power input terminals being connected to the collector of said second transistor via a second constant current circuit;
   a signal output terminal connected to a junction between the collector of said second transistor and said second constant current circuit and supplying a load with an amplified signal; and
   a phase compensating element connected between the collector of said second transistor and the base of said first transistor;
   whereby, among said first and second constant current circuits, the set current of said constant current circuit on the positive power input terminal side is set to be greater than that of said constant current circuit on the negative power input terminal side.

2. An amplification stage for a direct-coupled DC amplification circuit, comprising in combination:
   differential input terminals connected to a signal voltage source;
   a first pair of transistors, each having the base thereof connected to corresponding one of the input terminals, respectively;
   positive and negative power input terminals, one of which being connected to the collectors of said first pair of transistors via first and second constant current circuits, respectively, and the other of which being connected to the emitters of said first pair of transistors via a common third constant current circuit;

a second pair of transistors of a type complementary to said first pair of transistors, having the emitters thereof connected to junctions between the collectors of said first pair of transistors and said first and second constant current circuits, respectively;

a bias voltage source connected to the base of each transistor of said second pair of transistors and supplying said second pair of transistors with a bias voltage of a value between the power voltage on the side of said first and second constant current circuits and the ground voltage;

fourth and fifth constant current circuits connected between the collectors of said second pair of transistors and the other of the positive and negative power terminals, respectively;

differential signal output terminals connected to junctions between the collectors of said second pair of transistors and said fourth and fifth constant current circuits, respectively, and supplying a load with an amplified signal; and phase compensating elements connected between the collectors of said second pair of transistors and the base of said first pair of transistors, respectively;

whereby, among said first and second constant current circuits and said fourth and fifth constant current circuits, set currents, which are equal to each other, of said constant current circuits on the positive power input terminal side are so set as to be greater than set currents, which are equal to each other, of said constant current circuits on the negative power input terminal side.

3. An amplification stage for a direct-coupled DC amplification circuit, comprising in combination:

an input terminal connected to a signal voltage source;

a first pair of transistors, including first and second transistors which are complementary to each other, each having the base thereof connected to said input terminal, and the emitter thereof grounded;

positive and negative power input terminals, one of which being connected to the collector of said first transistor via a first constant current circuit, and the other of which being connected to the collector of said second transistor via a second constant current circuit;

a second pair of transistors, including third and fourth transistors which are complementary to each other, said third transistor being complementary to said first transistor and having its emitter connected to a junction between the collector of said first transistor and said first constant current circuit, said fourth transistor being complementary to said second transistor and having its emitter connected to a junction between the collector of said second transistor and said second constant current circuit;

bias voltage source means connected to the bases of said third and fourth transistors and supplying said third transistor with a first bias voltage of a value between the power voltage on the side of said first constant current circuit and the ground voltage, while supplying said fourth transistor with a second bias voltage of a value between the power voltage on the side of said second constant current circuit and the ground voltage;

a signal output terminal connected to the collectors of said second pair of transistors, and supplying a load with an amplified signal; and a phase compensating element connected between the collectors of said second pair of transistors and the bases of said first pair of transistors;

whereby set current, which are equal to each other, of said first and second constant current circuits, are so set as to be greater than set currents, which are equal to each other, of said first pair of transistors flowing therethrough in the idling condition.

* * * * *